(12) United States Patent
Yun et al.

(10) Patent No.: US 11,348,959 B2
(45) Date of Patent: May 31, 2022

(54) CMOS IMAGE SENSORS

(71) Applicant: Samsung Electronics Co., Ltd., Suwon-si (KR)

(72) Inventors: Jung Bin Yun, Hwaseong-si (KR); Kyungho Lee, Suwon-si (KR); Sung-Ho Choi, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 226 days.

(21) Appl. No.: 16/775,519

(22) Filed: Jan. 29, 2020

(65) Prior Publication Data

US 2020/0168644 A1 May 28, 2020

Related U.S. Application Data

(63) Continuation of application No. 15/405,451, filed on Jan. 13, 2017.

(30) Foreign Application Priority Data

Jan. 15, 2016 (KR) .................. 10-2016-0005546

(51) Int. Cl.
*H01L 27/146* (2006.01)

(52) U.S. Cl.
CPC ...... *H01L 27/1463* (2013.01); *H01L 27/1461* (2013.01); *H01L 27/14614* (2013.01); *H01L 27/14621* (2013.01); *H01L 27/14627* (2013.01); *H01L 27/14645* (2013.01)

(58) Field of Classification Search
CPC ............ H01L 27/1463; H01L 27/1461; H01L 27/14614; H01L 27/14621; H01L 27/14627; H01L 27/14645; H01L 21/8238; H01L 27/0922; H01L 27/11812; H01L 2027/11814; H01L 2027/11816; H01L 2027/11818; H01L 2027/1182

See application file for complete search history.

(56) References Cited

U.S. PATENT DOCUMENTS

| 6,657,665 | B1 | 12/2003 | Guidash |
| 7,830,437 | B2 | 11/2010 | McKee et al. |
| 7,964,929 | B2 | 6/2011 | Fan |
| 8,314,870 | B2 | 11/2012 | Itonaga et al. |
| 8,502,897 | B2 | 8/2013 | Sano |

(Continued)

FOREIGN PATENT DOCUMENTS

JP 2015-162646 A 9/2015

*Primary Examiner* — Samuel Park
(74) *Attorney, Agent, or Firm* — Harness, Dickey & Pierce, P.L.C.

(57) ABSTRACT

Disclosed is a complementary metal oxide semiconductor (CMOS) image sensor. The image sensor comprises a first separation zone in a substrate, the first separation zone defining first and second pixel regions arranged in a first direction, the first separation zone including first parts substantially parallel extending in the first direction, and the substrate including a first active region vertically overlapping one of the first parts and a second active region vertically overlapping another of the first parts. The image sensor further comprises first and second photoelectric conversion devices arranged in the first direction on at least one of the first and second pixel regions in the substrate, and a source follower gate on the first active region of the substrate.

21 Claims, 11 Drawing Sheets

(56) References Cited

U.S. PATENT DOCUMENTS

| | | |
|---|---|---|
| 8,736,005 B2 | 5/2014 | Kobayashi et al. |
| 9,191,026 B2 | 11/2015 | Oike et al. |
| 2006/0119715 A1 | 6/2006 | Nam |
| 2009/0046189 A1* | 2/2009 | Yin .................. H01L 27/14603 348/308 |
| 2011/0180689 A1* | 7/2011 | Roy .................. H01L 27/14609 250/208.1 |
| 2011/0273597 A1 | 11/2011 | Ishiwata |
| 2013/0264467 A1 | 10/2013 | Hong et al. |
| 2014/0117209 A1 | 5/2014 | Kwon |
| 2014/0291793 A1* | 10/2014 | Tanaka ............. H01L 27/14645 257/435 |
| 2015/0002713 A1* | 1/2015 | Nomura ............. H01L 27/1464 348/302 |
| 2016/0043132 A1 | 2/2016 | Ihara |
| 2016/0172412 A1* | 6/2016 | Lee .................. H01L 27/14605 257/432 |
| 2017/0013211 A1* | 1/2017 | Kato .................. H04N 5/3745 |
| 2017/0171470 A1* | 6/2017 | Sakioka ............ H01L 27/14607 |
| 2017/0244915 A1* | 8/2017 | Yamazaki .......... H04N 5/37457 |
| 2018/0033813 A1* | 2/2018 | Suzuki ............. H01L 27/14634 |
| 2018/0182794 A1* | 6/2018 | Go .................... H01L 27/14641 |
| 2018/0270438 A1* | 9/2018 | Niwa ................ H01L 27/14636 |

\* cited by examiner

CMOS IMAGE SENSORS

CROSS-REFERENCE TO RELATED APPLICATIONS

This application is a continuation application of U.S. application Ser. No. 15/405,451, filed Jan. 13, 2017, which claims the benefit of priority under 35 U.S.C. § 119 of Korean Patent Application 10-2016-0005546 filed on Jan. 15, 2016, the entire contents of each of which are hereby incorporated by reference.

BACKGROUND

The inventive concepts relate to an image sensor and, more particularly, to a complementary metal oxide semiconductor (CMOS) image sensor.

An image sensor transforms optical images into electrical signals. Recent advances in computer and communication industries have led to a strong demand in high performance image sensors in various consumer electronic devices such as digital cameras, camcorders, PCSs (Personal Communication Systems), game devices, security cameras, medical micro cameras, etc.

Image sensors are typically classified into various types, including a charge coupled device (CCD) type and a complementary metal oxide semiconductor (CMOS) type. CMOS image sensors have simple operating methods and may be minimized since signal processing circuits can be integrated into a single chip. CMOS image sensors require relatively small power consumption, which is useful in devices with limited battery capacity. Additionally, the fabricating cost can be reduced by compatibly using CMOS fabrication technologies. Accordingly, the use of CMOS image sensors has been rapidly increasing as a result of these advances in implementation of high resolution.

SUMMARY

Example embodiments of the inventive concepts provide a method of forming a fine pattern configured to easily form fine patterns with a fine pitch.

According to example embodiments of the inventive concepts, a complementary metal oxide semiconductor (CMOS) image sensor may include a first separation zone in a substrate, the first separation zone defining first and second pixel regions arranged in a first direction, the first separation zone including first parts substantially parallel extending in the first direction, and the substrate including a first active region vertically overlapping one of the first parts and a second active region vertically overlapping another of the first parts, first and second photoelectric conversion devices arranged in the first direction on each, or one or more, of the first and second pixel regions in the substrate, and a source follower gate on the first active region of the substrate.

According to example embodiments of the inventive concepts, a complementary metal oxide semiconductor (CMOS) image sensor may include a pixel separation zone in a substrate, wherein the pixel separation zone defines pixel regions spaced apart from each other in crossing first and second directions and includes first parts substantially parallel extending in the first direction and a second part between the first parts, the second part extending substantially parallel to the first parts, a first floating diffusion region in the substrate between a first pair of the pixel regions facing each other in the second direction, the first floating diffusion region overlapping the second part, a second floating diffusion region in the substrate between a second pair of the pixel regions facing each other in the second direction, the second floating diffusion region overlapping the second part, and a source follower gate on the substrate and overlapping one of the first parts. The first and second floating diffusion regions and the source follower gate may be connected to one another.

Example embodiments relate to a complementary metal oxide semiconductor (CMOS) image sensor that includes a first pixel region and a second pixel region aligned in a first direction, the first and second pixel regions including a plurality of photoelectric conversion devices, and a selection gate, a reset gate, and a source follower gate, at least two of the selection gate, the reset gate and the source follower gate being aligned along a second direction substantially perpendicular to the first direction.

BRIEF DESCRIPTION OF THE DRAWINGS

The accompanying drawings are included to provide a further understanding of the example embodiments, and are incorporated in and constitute a part of this specification. The drawings illustrate example embodiments of the example embodiments and, together with the description, serve to explain principles of the example embodiments. In the drawings.

DETAILED DESCRIPTION OF EMBODIMENTS

Figure 1:
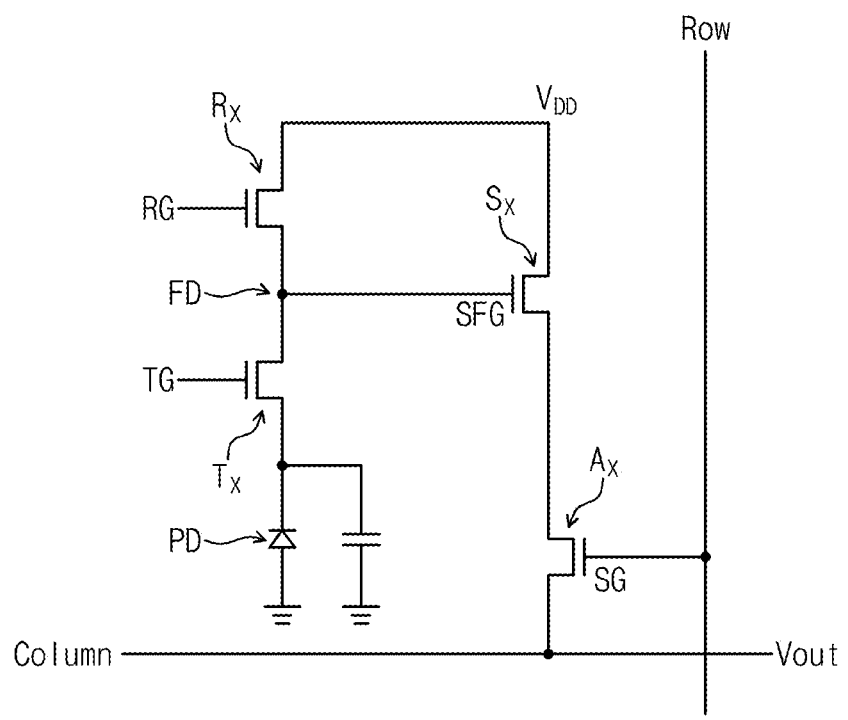
FIG. 1 is a circuit diagram of a CMOS image sensor according to example embodiments of the inventive concepts.

These and other features and advantages are described in, or are apparent from, the following detailed description of various example embodiments.

It will be understood that when an element is referred to as being "on," "connected" or "coupled" to another element, it can be directly on, connected or coupled to the other element or intervening elements that may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a circuit diagram of a CMOS image sensor according to example embodiments of the inventive concepts.

Referring to FIG. 1, a CMOS image sensor may include a plurality of unit pixels, each, or one or more, of which includes a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may include a transfer gate TG, a source follower gate SFG, a reset gate RG, and a selection gate SG, respectively. A photoelectric conversion portion may be provided in the photoelectric conversion region PD. The photoelectric conversion portion may be a photodiode including an n-type impurity region and a p-type impurity region. The transfer transistor Tx may include a drain region serving as a floating diffusion region FD. The floating diffusion region FD may also serve as a source region of the reset transistor Rx. The floating diffusion region FD may be electrically connected to the source follower gate SFG of the source follower transistor Sx. The source follower transistor Sx may be coupled to the selection transistor Ax. The reset transistor Rx, the source follower transistor Sx, and the selection transistor Ax may be shared by adjacent pixels, and thus may increase an integration density.

Hereinafter, operations of the image sensor will be discussed with reference to, for example, FIG. 1. When in a light-blocked state, a power voltage $V_{DD}$ may be applied to a drain region of the reset transistor Rx and a drain region of the source follower transistor Sx to discharge electric charges from the floating diffusion region FD. Thereafter, if the reset transistor Rx is turned-off and external light is incident into the photoelectric conversion region PD, electron-hole pairs may be generated in the photoelectric conversion region PD. Holes may be moved toward the p-type doped region, and electrons may be moved toward and accumulated in the n-type doped region. If the transfer transistor Tx is turned on, the electrons may be transferred to, and accumulated in, the floating diffusion region FD. A gate bias of the source follower transistor Sx may be changed in proportion to the amount of the accumulated charges in the floating diffusion region FD, and this may lead to a change in source potential of the source follower transistor Sx. At this time, if the selection transistor Ax is turned on, an amount of the electrons may be read out as a signal to be transmitted through a column line.

Figure 2:
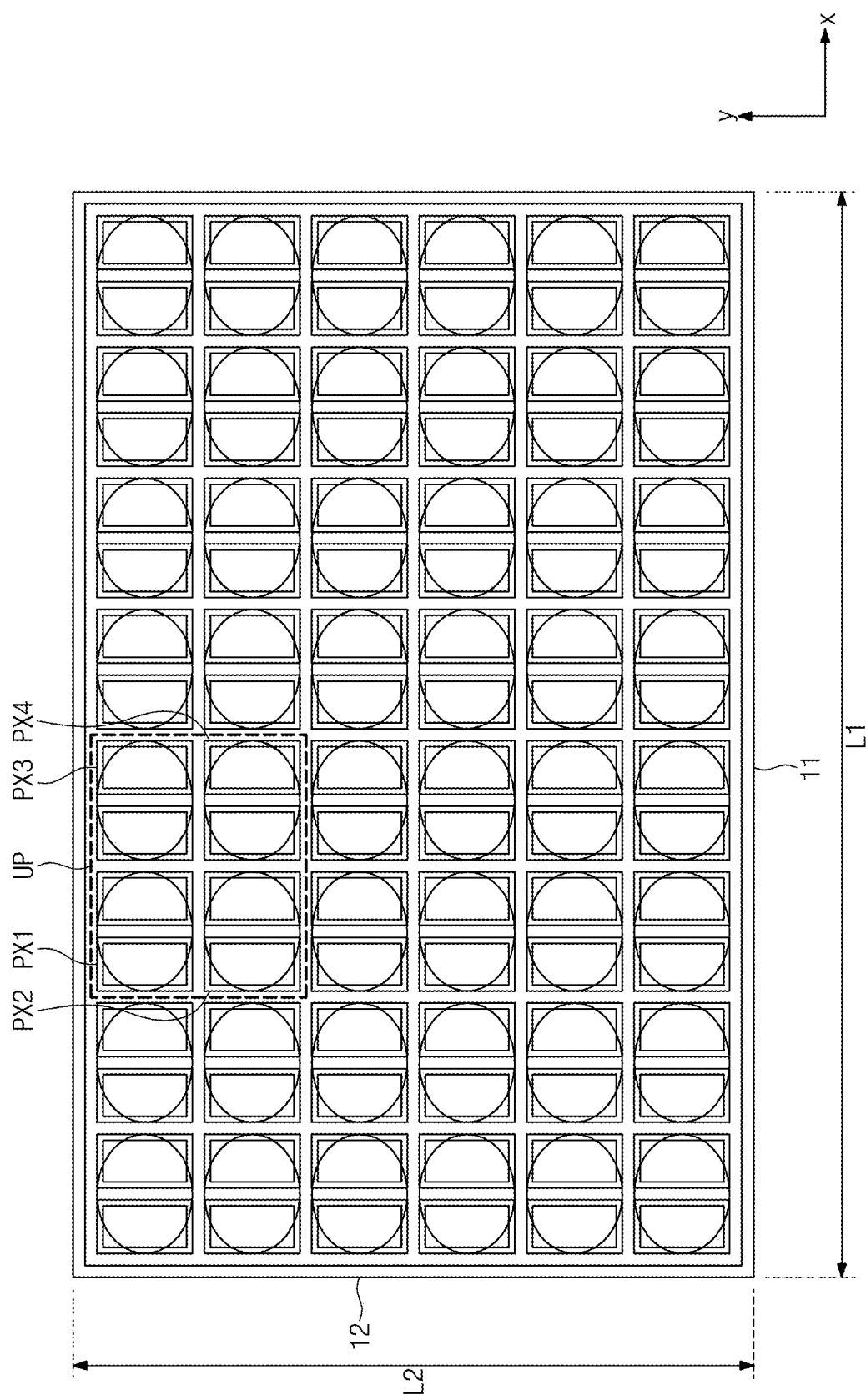
FIG. 2 is a plan view illustrating a CMOS image sensor according to example embodiments of the inventive concepts.
Figure 3:
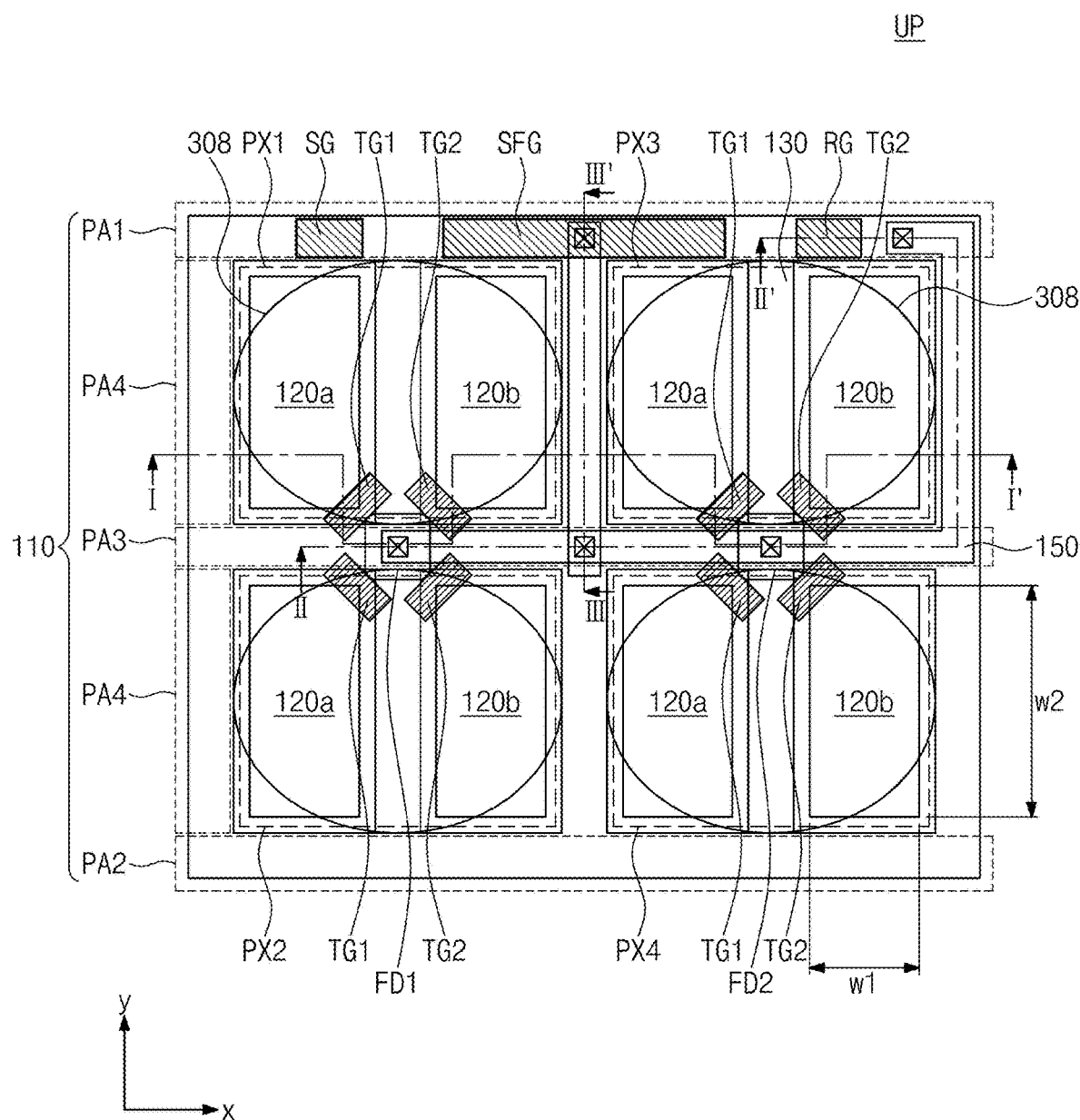
FIG. 3 is an enlarged plan view of a unit pixel depicted in FIG. 2.
Figure 4:
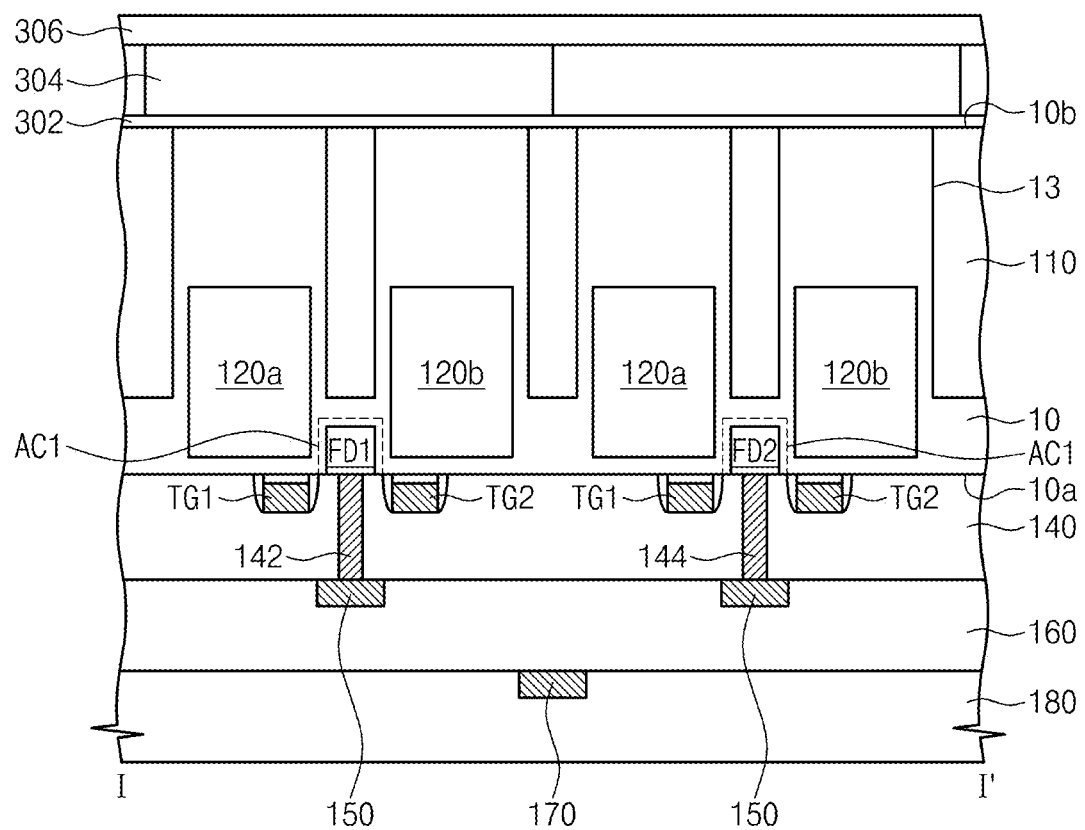
FIGS. 4, 5 and 6 are cross-sectional views taken along lines I-I', II-II' and III-III' of FIG. 3.
Figure 5:
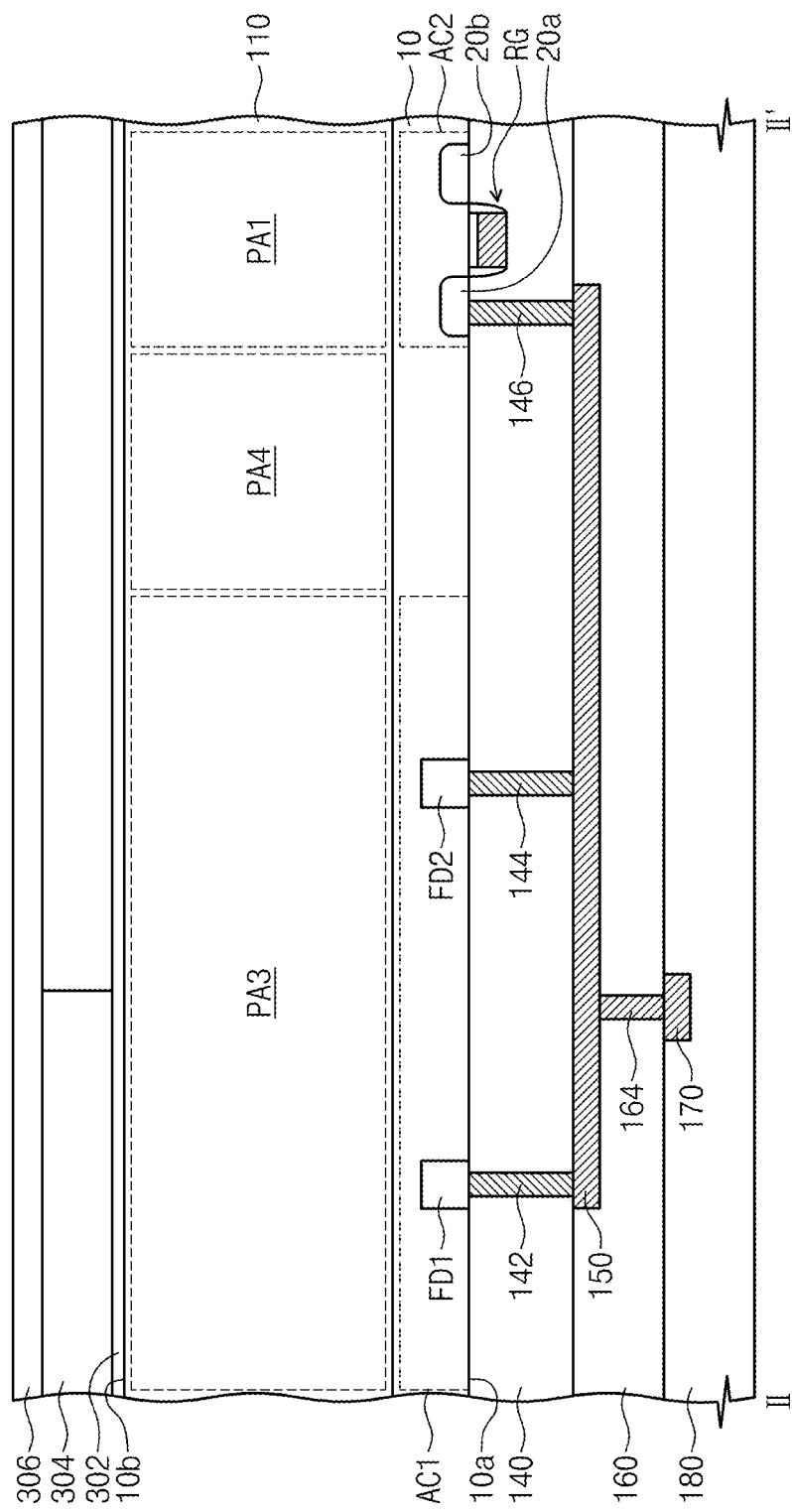
Figure 6:
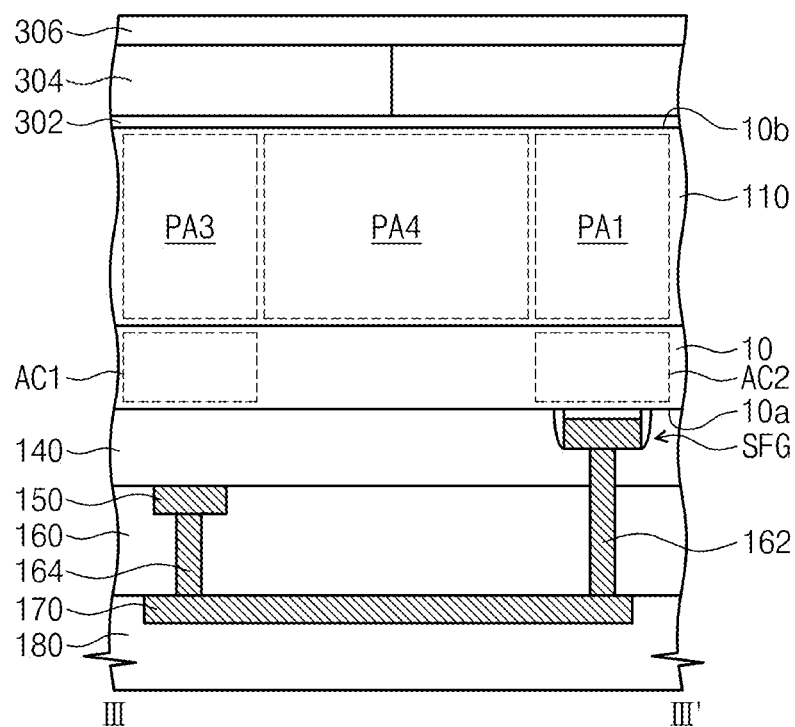

FIG. 2 is a plan view illustrating a CMOS image sensor according to example embodiments of the inventive concepts. FIG. 3 is an enlarged plan view of a unit pixel depicted in FIG. 2. FIGS. 4, 5 and 6 are cross-sectional views taken along lines I-I', II-II' and III-III' of FIG. 3.

Referring to FIGS. 2 through 6, a substrate 10 may include a plurality of pixel regions PX1 to PX4. The pixel regions PX1 to PX4 may be spaced apart from each other in crossing first and second directions X and Y. For example, the number of the pixel regions PX1 to PX4 arranged in the first direction X may be greater than the number of pixel regions PX1 to PX4 arranged in the second direction Y. Accordingly, as viewed in plan view, the substrate 10 may include a first side 11 having a length L1 extending in the first direction X and a second side 12 having a length L2 extending in the second direction Y, and the length L1 of the first side 11 may be greater than the length L2 of the second side 12.

The pixel regions PX1 to PX4 may include a first pixel region PX1, a second pixel region PX2, a third pixel region PX3, and a fourth pixel region PX4. The first and second pixel regions PX1 and PX2 may be disposed to face each other in the second direction Y, and the third and fourth pixel regions PX3 and PX4 may be disposed to face each other in the second direction Y. The first and third pixel regions PX1 and PX3 may be disposed to face each other in the first direction X, and the second and fourth pixel regions PX2 and PX4 may be disposed to face each other in the first direction X. For example, the first to fourth pixel regions PX1 to PX4 may constitute a single unit pixel UP.

The substrate 10 may include a front surface 10a and a backside surface 10b that are opposite to each other. The backside surface 10b of the substrate 10 may correspond to a light incident surface. The substrate 10 may include, for example, a semiconductor substrate (e.g., a silicon substrate, a germanium substrate, a silicon-germanium substrate, a Group II-VI compound semiconductor substrate, or a Group III-V compound semiconductor substrate) or a SOI (silicon on insulator) substrate. The substrate 10 may include p-type impurities.

The first to fourth pixel regions PX1 to PX4 may be defined by a first separation zone 110 disposed in the substrate 10. The first separation zone 110 may have a top surface coplanar with the backside surface 10b of the substrate 10. The first separation zone 110 may also have a bottom surface which is disposed in the substrate 10 and positioned more adjacent to the front surface 10a than the backside surface 10b of the substrate 10.

The first separation zone 110 may include a first segment PA1, a second segment PA2, and a third segment PA3. The first and second segments PA1 and PA2 may extend in the first direction X and disposed adjacent to each other in the second direction Y. The third segment PA3 may extend substantially parallel to and disposed between the first and second segments PA1 and PA2. The first separation zone 110 may further include fourth segments PA4 extending in the second direction Y. The fourth segments PA4 may be disposed between the first and third segments PA1 and PA3 and between the second and third segments PA2 and PA3. The third segment PA3 of the first separation zone 110 may be disposed between the first and second pixel regions PX1 and PX2 facing each other in the second direction Y and between the third and fourth pixel regions PX3 and PX4 facing each other in the second direction Y.

The first separation zone 110 may include an insulation layer. In this case, the first separation zone 110 may be formed by recessing the backside surface 10b of the substrate 10 to form a trench 13, and filling the trench 13 with an insulating material. Alternatively, the first separation zone 110 may include an impurity region. In this case, the first separation zone 110 may be formed by doping impurity ions into the substrate 10. For example, the first separation zone 110 may be of the same conductivity but of a higher impurity concentration than the substrate 10.

First and second photoelectric conversion devices 120a and 120b may be disposed on each, or one or more, of the first to fourth pixel regions PX1 to PX4 in the substrate 10. In other words, two photoelectric conversion devices may be disposed on one single pixel region. The first and second photoelectric conversion devices 120a and 120b may be arranged in the first direction X. A pair of the first and second photoelectric conversion devices 120a and 120b may be surrounded by the first separation zone 110. The first and second photoelectric conversion devices 120a and 120b may be two-dimensionally arranged in the substrate 10. The first and second photoelectric conversion devices 120a and 120b may be disposed more adjacent to the front surface 10a of the substrate 10 than the backside surface 10b of the substrate 10. Each, or one or more, of the first and second photoelectric conversion devices 120a and 120b may independently receive light incident on the backside surface 10b of the substrate 10. The first and second photoelectric conversion devices 120a and 120b may include, for example, n-type impurities.

As viewed in plan view, each, or one or more, of the first and second photoelectric conversion devices 120a and 120b may have a first width w1 substantially parallel to the first side 11 of the substrate 10 and a second width w2 substantially parallel to the second side 12 of the substrate 10. For example, the first width w1 may be less than the second width w2.

A second separation zone 130 may be disposed on each, or one or more, of the first to fourth pixel regions PX1 to PX4 in the substrate 10. The second separation zone 130 may be disposed between the first and second photoelectric conversion devices 120a and 120b. The second separation zone 130 may separate the first and second photoelectric conversion devices 120a and 120b that are disposed on one pixel region. As illustrated in FIG. 3, the second separation zone 130 may be in contact with the first separation zone 110. Alternatively, the second separation zone 130 may be spaced apart from the first separation zone 110.

The second separation zone 130 may include an insulation layer. In this case, the second separation zone 130 may be formed by recessing the backside surface 10b of the substrate 10 to form a trench (not shown) and filling the trench with an insulating material. Alternatively, the second separation zone 130 may include an impurity region. In this case, the second separation zone 130 may be formed by doping impurity ions into the substrate 10. For example, the second separation zone 130 may be of the same conductivity but of a higher impurity concentration than the substrate 10.

First and second floating diffusion regions FD1 and FD2 may be disposed in the substrate 10. The first floating diffusion region FD1 may be disposed in a first active region AC1 of the substrate 10 between a pair of the first and second pixel regions PX1 and PX2 facing each other in the second direction Y. The second floating diffusion region FD2 may be disposed in the first active region AC1 of substrate 10 between a pair of the third and fourth pixel regions PX3 and PX4 facing each other in the second direction Y. The first active region AC1 of the substrate 10 may correspond to a portion of the substrate 10 which vertically overlaps the third segment PA3 of the first separation zone 110. In other words, the first and second floating diffusion regions FD1 and FD2 may vertically overlap the third segment PA3 of the first separation zone 110. The first and second floating diffusion regions FD1 and FD2 may be spaced apart from each other in the first direction X.

The first floating diffusion region FD1 may be connected to a pair of the first and second photoelectric conversion devices 120a and 120b in the first pixel region PX1 and a pair of the first and second photoelectric conversion devices 120a and 120b in the second pixel region PX2. That is, the first floating diffusion region FD1 may be connected to four photoelectric conversion devices. The second floating diffusion region FD2 may be connected to a pair of the first and second photoelectric conversion devices 120a and 120b in the third pixel region PX3 and a pair of first and second photoelectric conversion devices 120a and 120b in the fourth pixel region PX4. That is, the second floating diffusion region FD2 may be connected to four photoelectric conversion devices. The first and second floating diffusion region FD1 and FD2 may include, for example, n-type impurities.

First and second transfer gates TG1 and TG2 may be disposed on each, or one or more, of the first to fourth pixel regions PX1 to PX4 in the substrate 10. The first transfer gate TG1 may be disposed to correspond to the first photoelectric conversion device 120a, and the second transfer gate TG2 may be disposed to correspond to the second photoelectric conversion device 120b.

For example, the first transfer gate TG1 disposed on the front surface 10a of the substrate 10 in the first pixel region PX1 may be provided between the first photoelectric conversion device 120a and the first floating diffusion region FD1 in the first pixel region PX1. The second transfer gate TG2 disposed on the front surface 10a of the substrate 10 in the first pixel region PX1 may be provided between the second photoelectric conversion device 120b and the first floating diffusion region FD1 in the first pixel region PX1.

The first transfer gate TG1 disposed on the front surface 10a of the substrate 10 in the second pixel region PX2 may be provided between the first photoelectric conversion device 120a and the first floating diffusion region FD1 in the second pixel region PX2. The second transfer gate TG2 disposed on the front surface 10a of the substrate 10 in the second pixel region PX2 may be provided between the second photoelectric conversion device 120b and the first floating diffusion region FD1 in the second pixel region PX2.

In an example embodiment, the first floating diffusion region FD1 may be shared by the first and second transfer gates TG1 and TG2 on the substrate 10 in the first pixel region PX1 and the first and second transfer gates TG1 and TG2 on the substrate 10 in the second pixel region PX2. In other words, four transfer gates may share one first floating diffusion region FD1.

Likewise or similarly to those discussed above, the first transfer gate TG1 disposed on the front surface 10a of the substrate 10 in the third pixel region PX3 may be provided between the first photoelectric conversion device 120a and the second floating diffusion region FD2 in the third pixel region PX3. The second transfer gate TG2 disposed on the front surface 10a of the substrate 10 in the third pixel region PX3 may be provided between the second photoelectric conversion device 120b and the second floating diffusion region FD2 in the third pixel region PX3.

The first transfer gate TG1 disposed on the front surface 10a of the substrate 10 in the fourth pixel region PX4 may be provided between the first photoelectric conversion device 120a and the second floating diffusion region FD2 in the fourth pixel region PX4. The second transfer gate TG2 disposed on the front surface 10a of the substrate 10 in the fourth pixel region PX4 may be provided between the second photoelectric conversion device 120b and the second floating diffusion region FD2 in the fourth pixel region PX4.

In an example embodiment, the second floating diffusion region FD2 may be shared by the first and second transfer gates TG1 and TG2 on the substrate 10 in the third pixel region PX3 and the first and second transfer gates TG1 and TG2 on the substrate 10 in the fourth pixel region PX4. In other words, four transfer gates share one second floating diffusion region FD2.

The reset gate RG, the source follower gate SFG, and the selection gate SG may be disposed on the front surface 10a of the substrate 10. For example, the reset, source follower, and selection gates RG, SFG and SG may be disposed on a second active region AC2 of the substrate 10. The second active region AC2 of the substrate 10 may correspond to a portion of the substrate 10 which vertically overlaps the first segment PA1 of the first separation zone 110. In other words, the reset, source follower, and selection gates RG, SFG and SG may vertically overlap the first segment PA1 of the first separation zone 110.

As viewed in plan view, the reset, source follower, and selection gates RG, SFG and SG may be spaced apart from each other in the first direction X. For example, the reset, source follower, and selection gates RG, SFG and SG may be substantially linearly arranged in the first direction X. The source follower gate SFG may be disposed between the reset gate RG and the selection gate SG. The source follower gate SFG may have a major axis parallel to the first direction.

As viewed in plan view, the reset, source follower, and selection gates RG, SFG and SG may be disposed adjacent to four photoelectric conversion devices. For example, the reset, source follower, and selection gates RG, SFG and SG may be disposed adjacent to the first and second photoelectric conversion devices 120a and 120b in the first pixel region PX1 and the first and second photoelectric conversion devices 120a and 120b in the third pixel region PX3.

In an example embodiment, the source follower gate SFG may be disposed on the second active region AC2 which width is substantially the same as the width of a single unit pixel that is occupied with four photoelectric conversion devices. Accordingly, a planar area on which the source follower gate SFG can be disposed is increased such that an area and/or size of the source follower gate SFG are expanded. As a result, it may be possible to reduce or substantially prevent malfunction of the source follower transistor owing to the noise generated when the CMOS images sensor is operated. Moreover, since the reset, source follower, and selection gates RG, SFG and SG are substantially linearly disposed on the second active region AC2 of the substrate 10, it may be advantageous to increase areas of the photoelectric conversion devices.

First and second impurity regions 20a and 20b may be disposed in the substrate 10 opposite sides of each, or one or more, of the reset, source follower, and selection gates RG, SFG, and SG. The first and second impurity regions 20a and 20b may be formed by ion implanting impurities having a conductivity type opposite to that of the substrate 10. For example, the first and second impurity regions 20a and 20b may be doped with n-type impurities.

A first interlayer dielectric layer 140 may be formed on the front surface 10a of the substrate 10. The first interlayer dielectric layer 140 may cover the first and second transfer gates TG1 and TG2, the reset gate RG, the source follower gate SFG, and the selection gate SG. The first interlayer dielectric layer 140 may further cover the first and second floating diffusion regions FD1 and FD2 that are exposed at the front surface 10a of the substrate 10. The first interlayer dielectric layer 140 may include, for example, a silicon oxide layer.

First, second and third contact plugs 142, 144 and 146 may be disposed in the first interlayer dielectric layer 140. The first contact plug 142 may be in contact with and electrically connected to the first floating diffusion region FD1. The second contact plug 144 may be in contact with and electrically connected to the second floating diffusion region FD2. The third contact plug 146 may be in contact with and electrically connected to the first impurity region 20a of the reset gate RG. For example, the first impurity region 20a of the reset gate RG may correspond to a drain region.

The first to third contact plugs 142, 144 and 146 may include a barrier metal layer (e.g., a metal nitride layer inclusive of titanium nitride, tantalum nitride, and/or tungsten nitride) and/or a metal layer (e.g., tungsten, copper, hafnium, zirconium, titanium, tantalum, etc.). For example, not shown in figures, a silicide layer may be further provided between the impurity regions and the first to third contact plugs 142, 144 and 146.

A first line 150 may be disposed on the first interlayer dielectric layer 140. The first line 150 may electrically connect the first to third contact plugs 142, 144 and 146 with one another. Accordingly, the first floating diffusion region FD1, the second floating diffusion region FD2, and the first impurity region 20a of the reset gate RG may be commonly and electrically connected with one another through the first line 150. For example, the first line 150 may extend in the first direction X on the third segment PA3 of the first separation zone 110 to be in contact with the first and second contact plugs 142 and 144. And, the first line 150 may extend in the second direction Y on one of the fourth segments PA4 of the first separation zone 110 to be in contact with the third contact plug 146. The first line 150 may include a metal layer (e.g., tungsten, copper, hafnium, zirconium, titanium, tantalum, etc.).

A second interlayer dielectric layer 160 may be formed on the first interlayer dielectric layer 140. The second interlayer dielectric layer 160 may include, for example, a silicon oxide layer.

Fourth and fifth contact plugs 162 and 164 may be disposed in the second interlayer dielectric layer 160. The fourth contact plug 162 may be in contact with and electrically connected to the source follower gate SFG. The fifth contact plug 146 may be in contact with and electrically connected to the first line 150. The fourth and fifth contact plugs 162 and 164 may include a barrier metal layer (e.g., a metal nitride layer inclusive of titanium nitride, tantalum nitride, and/or tungsten nitride) and/or a metal layer (e.g., tungsten, copper, hafnium, zirconium, titanium, tantalum, etc.).

A second line 170 may be disposed on the second interlayer dielectric layer 160. The second line 170 may be electrically connected to the fourth and fifth contact plugs 162 and 164.

The first floating diffusion region FD1, the second floating diffusion region FD2, and the source follower gate SFG may be commonly and electrically connected with one another through the second line 170. For example, the second line 170 may extend in the second direction Y on the fourth segment PA4 of the first separation zone 110 between the first and third pixel regions PX1 and PX3 and thus may be in contact with the fourth and fifth contact plugs 162 and 164. The second line 170 may include a metal layer (e.g., tungsten, copper, hafnium, zirconium, titanium, tantalum, etc.).

A third interlayer dielectric layer 180 may be disposed on the second interlayer dielectric layer 160. The third interlayer dielectric layer 180 may substantially cover the second line 170. The third interlayer dielectric layer 180 may include, for example, a silicon oxide layer.

An insulation layer 302 may be disposed on the backside surface 10b of the substrate 10. The insulation layer 302 may cover the backside surface 10b of the substrate 10. For example, the insulation layer 302 may function as an antireflective layer. The insulation layer 302 may include at least one of, for example, a silicon oxide layer, a silicon nitride layer, a silicon oxynitride layer, and a hafnium oxide layer.

Color filters 304 may be disposed on the insulation layer 302. The color filters 304 may be disposed to correspond to respectively the first to fourth pixel regions PX1 to PX4. For example, one single filter 304 may vertically overlap the first and second photoelectric conversion devices 120a and 120b disposed on one single unit pixel region.

The color filters 304 may include, for example, a green filter, a blue filter, and a red filter. The color filters 304 may be arranged in the Bayer pattern. The Bayer pattern may indicate a color filter array in which half of the total number of color filters is the green filter, which is the most sensitive to the human eye.

A planarization layer 306 may be disposed on the color filters 304. The planarization layer 306 may cover top surfaces of the color filters 304. The planarization layer 306 may include at least one of, for example, a silicon oxide layer, a silicon nitride layer, and a silicon oxynitride layer. Alternatively, the planarization layer 306 may include an organic layer.

Each, or one or more, of micro-lenses 308 may be disposed on each, or one or more, of the first to fourth pixel regions PX1 to PX4. Each, or one or more, of the micro-lenses 308 may be disposed to correspond to one of the color filters 304. For example, one single micro-lens 308 may vertically overlap the first and second photoelectric conversion devices 120a and 120b disposed on one single unit pixel region. As viewed in cross-sectional, as not shown in figures, the micro-lenses 308 may be disposed on the planarization layer 306.

Figure 7:
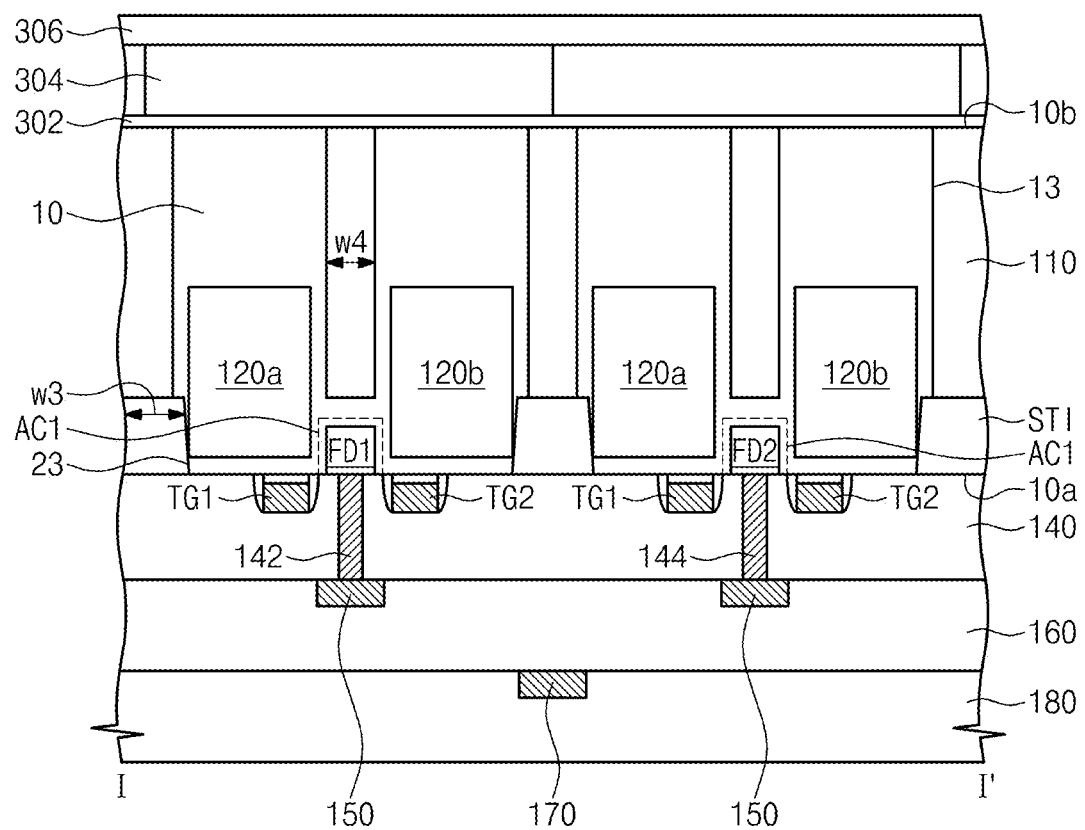
FIG. 7 is a cross-sectional view, taken along line I-I' of FIG. 3, illustrating a CMOS image sensor according to example embodiments of the inventive concepts.
Figure 8:
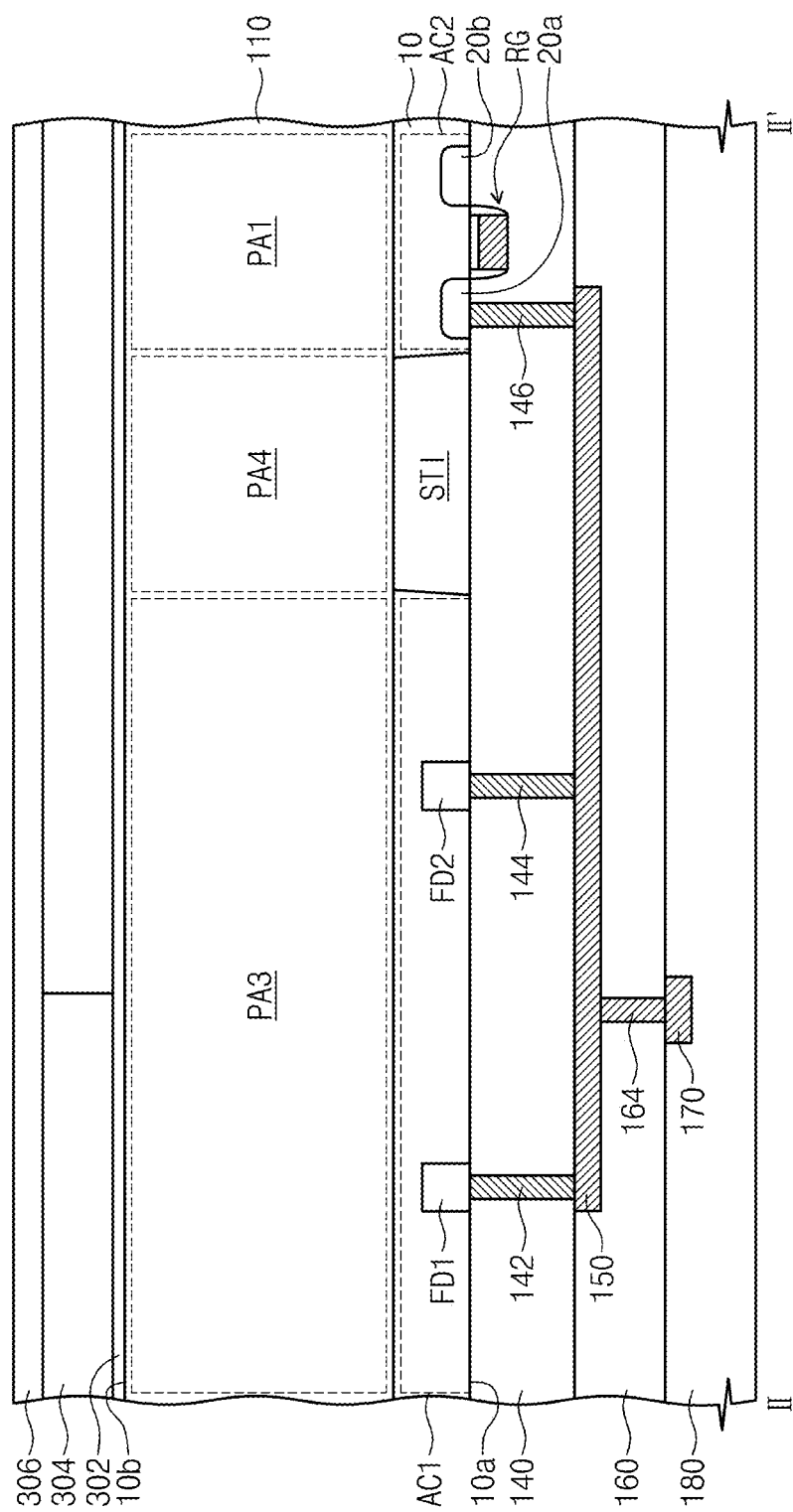
FIG. 8 is a cross-sectional view, taken along line II-II' of FIG. 3, illustrating a CMOS image sensor according to example embodiments of the inventive concepts.
Figure 9:
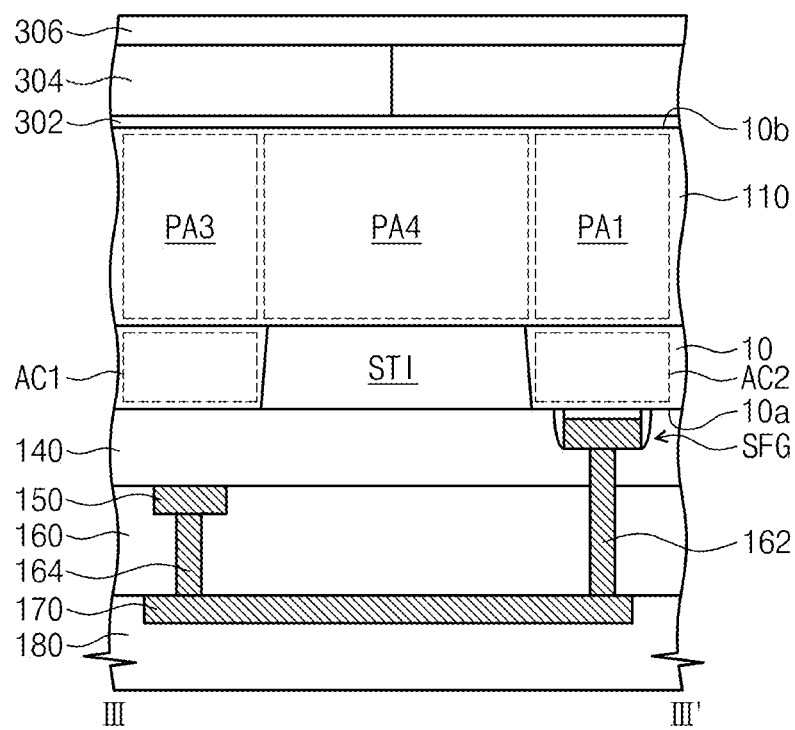
FIG. 9 is a cross-sectional view, taken along line III-III' of FIG. 3, illustrating a CMOS image sensor according to example embodiments of the inventive concepts.

FIG. 7 is a cross-sectional view, taken along line I-I' of FIG. 3, illustrating a CMOS image sensor according to example embodiments of the inventive concepts. FIG. 8 is a cross-sectional view, taken along line II-II' of FIG. 3, illustrating a CMOS image sensor according to example embodiments of the inventive concepts. FIG. 9 is a cross-sectional view, taken along line III-III' of FIG. 3, illustrating a CMOS image sensor according to example embodiments of the inventive concepts. In an example embodiment as illustrated in FIGS. 7 through 9, the same elements that are substantially identical to those discussed with reference to FIGS. 4 through 6 may have the same reference numerals, and detail descriptions thereof will be omitted in the interest of brevity.

Referring to FIGS. 7 through 9, a third separation zone STI may be disposed in the substrate 10. The third separation zone STI may have a top surface that is coplanar with the front surface 10a of the substrate 10. The third separation zone STI may also have a bottom surface that is disposed in the substrate 10 and positioned more adjacent to the front surface 10a of the substrate 10 than the backside surface 10b of the substrate 10. The third separation zone STI may be disposed in a portion of the substrate 10 which is not occupied with the first and second active regions AC1 and AC2 of the substrate 10. For example, the third separation zone STI may define the first and second active regions AC1 and AC2 of the substrate 10.

The third separation zone STI may vertically overlap the fourth segments PA4 of the first separation zone 110 in the substrate 10. Accordingly, the bottom surface of the third separation zone STI may be in contact with bottom surfaces of the fourth segments PA4 of the first separation zone 110. The third separation zone STI may have a width w3 that is greater than a width w4 of the first separation zone 110.

The third separation zone STI may include an insulation layer. In this case, the third separation zone STI may be formed by recessing the backsides surface 10b of the substrate 10 to form a trench 23 and filling the trench 23 with an insulating material. Alternatively, the third separation zone STI may include an impurity region. In this case, the third separation zone STI may be formed by doping impurity ions into the substrate 10. For example, the third separation zone STI may be of the same conductivity but of a higher impurity concentration than the substrate 10.

Alternatively, the first separation zone 110 may include the third separation zone STI. In this case, the first separation zone 110 may penetrate the substrate 10 and have sidewalls with portions that extend horizontally substantially parallel to the front surface 10a of the substrate 10. Accordingly, the fourth segments PA4 of the first separation zone 110 may have stepped sidewalls.

Figure 10:
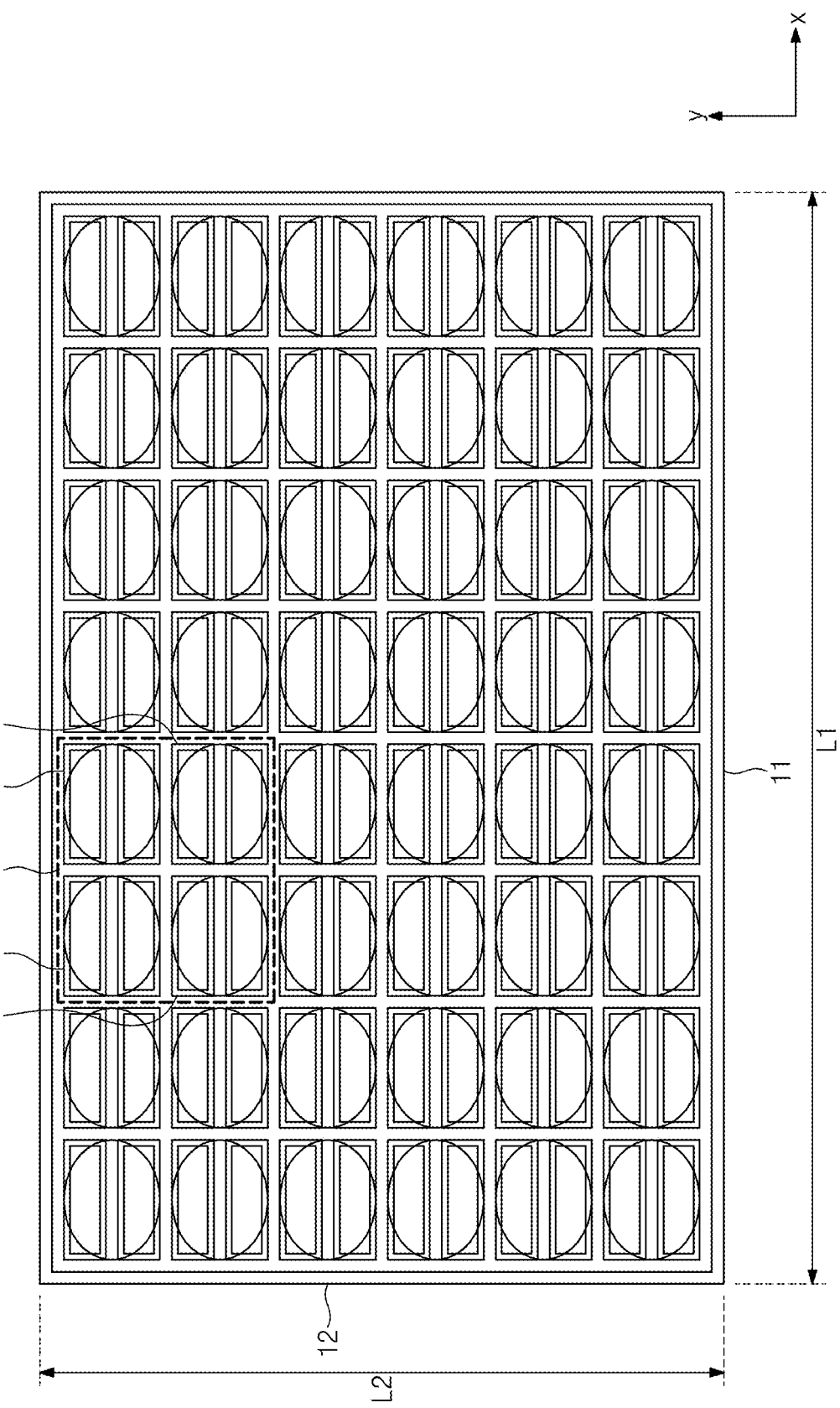
FIG. 10 is a plan view illustrating a CMOS image sensor according to example embodiments of the inventive concepts.
Figure 11:
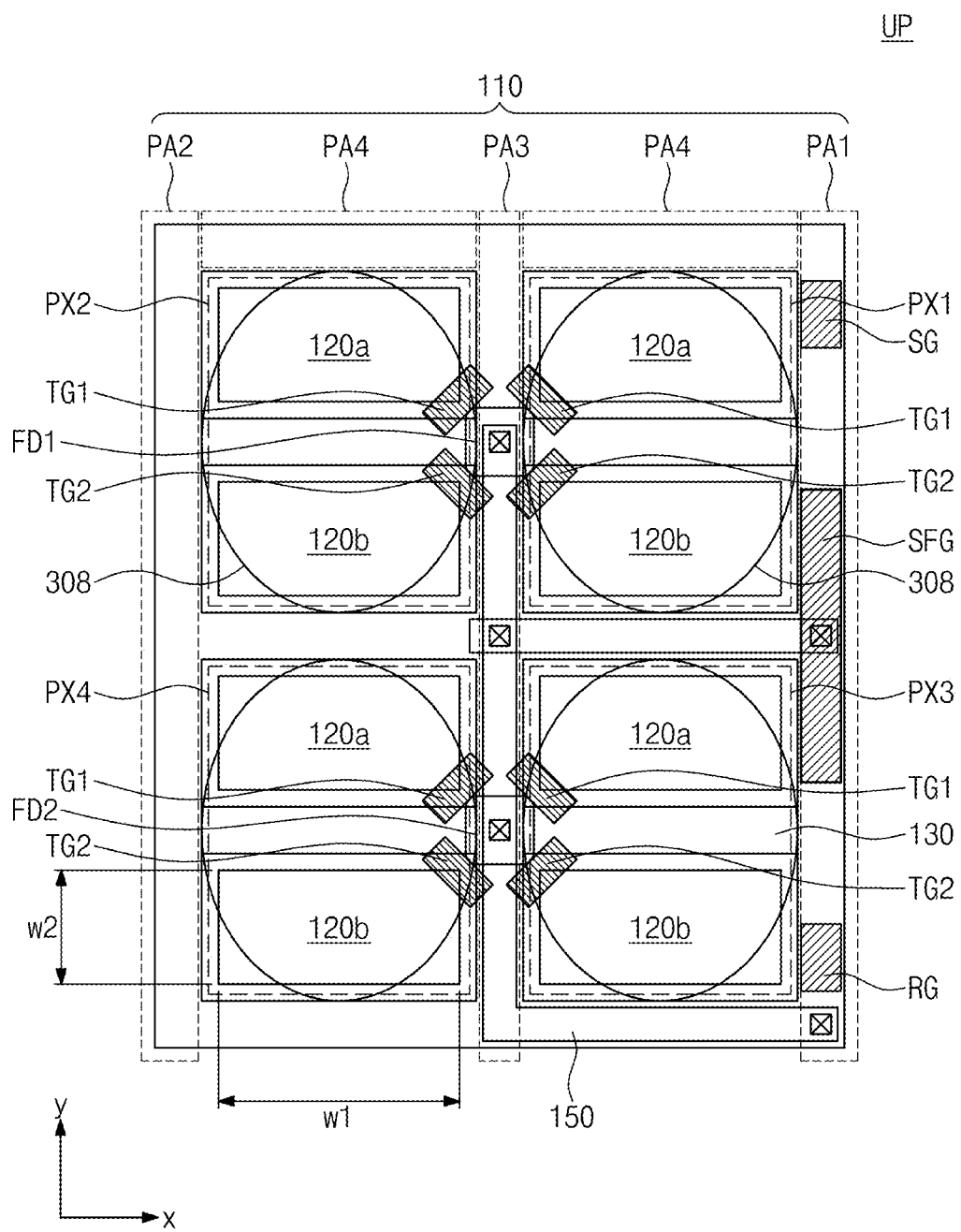
FIG. 11 is an enlarged plan view of a unit pixel depicted in FIG. 10.

FIG. 10 is a plan view illustrating a CMOS image sensor according to example embodiments of the inventive concepts. FIG. 11 is an enlarged plan view of a unit pixel depicted in FIG. 10. In an example embodiment, as illustrated in FIGS. 10 and 11, the same elements that are substantially identical to those discussed with referent to FIGS. 2 and 3 may have the same reference numerals, and detail descriptions thereof will be omitted in the interest of brevity.

Referring to FIGS. 10 and 11, a substrate 10 may include a plurality of pixel regions PX1 to PX4. The pixel regions PX1 to PX4 may be spaced apart from each other in crossing first and second directions X and Y. For example, the number of the pixel regions PX1 to PX4 arranged in the first direction X may be greater than the number of pixel regions PX1 to PX4 arranged in the second direction Y. Accordingly, as viewed in plan view, the substrate 10 may include a first side 11 having a length L1 extending in the first direction X and a second side 12 having a length L2 extending in the second direction Y, and the length L1 of the first side 11 may be greater than the length L2 of the second side 12.

In various example embodiments, the pixel regions PX1 to PX4 may include a first pixel region PX1, a second pixel region PX2, a third pixel region PX3, and a fourth pixel region PX4. The first and second pixel regions PX1 and PX2 may be disposed to face each other in the first direction X, and the third and fourth pixel regions PX3 and PX4 may be disposed to face each other in the first direction X. The first and third pixel regions PX1 and PX3 may be disposed to face each other in the second direction Y, and the second and fourth pixel regions PX2 and PX4 may be disposed to face each other in the second direction Y. For example, the first to fourth pixel regions PX1 to PX4 may constitute a single unit pixel UP.

The first separation zone 110 may include a first segment PA1, a second segment PA2, and a third segment PA3. The first and second segments PA1 and PA2 may extend in the second direction Y and disposed adjacent to each other in the first direction X. The third segment PA3 may extend substantially parallel to and between the first and second segments PA1 and PA2. The first separation zone 110 may further include fourth segments PA4 extending in the first direction X. The fourth segments PA4 may be disposed between the first and third segments PA1 and PA3 and between the second and third segments PA2 and PA3. The third segment PA3 of the first separation zone 110 may be disposed between the first and second pixel regions PX1 and PX2 facing each other in the first direction X and between the third and fourth pixel regions PX3 and PX4 facing each other in the first direction X.

First and second photoelectric conversion devices 120a and 120b may be disposed on each, or one or more, of the first to fourth pixel regions PX1 to PX4 in the substrate 10. In other words, two photoelectric conversion devices may be disposed on one single pixel region. The first and second photoelectric conversion devices 120a and 120b may be arranged in the second direction Y.

As viewed in plan view, each, or one or more, of the first and second photoelectric conversion devices 120a and 120b may have a first width w1 that is substantially parallel to the first side 11 of the substrate 10 and a second width w2 that is substantially parallel to the second side 12 of the substrate 10. For example, the first width w1 may be greater than the second width w2.

According to example embodiments, the source follower gate lies on the active region with a width that is substantially the same as the width of a single unit pixel occupied with four photoelectric conversion devices, and thus an area and/or size of the sourced follower gate are increased. As a result, it may be possible to reduce or substantially prevent malfunction of the source follower transistor owing to the noise generated when the CMOS images sensor is operated.

Although the example embodiments have been described in connection with examples illustrated in the accompanying drawings, they are not limited thereto. It will be apparent to those skilled in the art that various substitution, modifications and changes may be thereto without departing from the scope and spirit of the example embodiments.

What is claimed is:

1. A complementary metal oxide semiconductor (CMOS) image sensor, comprising:
a first pixel group comprising first to fourth photoelectric conversion devices, the first to fourth photoelectric conversion devices being arranged in a clockwise direction;
a second pixel group comprising fifth to eighth photoelectric conversion devices, the fifth to eighth photoelectric conversion devices being arranged in the clockwise direction;
a first separation zone in a substrate, the first separation zone being disposed between the first pixel group and the second pixel group;
a second separation zone in the substrate, the second separation zone being disposed between the first photoelectric conversion device and the second photoelectric conversion devices;
a third separation zone in the substrate, the third separation zone being disposed between the fifth photoelectric conversion device and the sixth photoelectric conversion device;
a first microlens disposed on the first and second photoelectric conversion devices;
a second microlens disposed on the third and fourth photoelectric conversion devices;
a third microlens disposed on the fifth and sixth photoelectric conversion devices;
a fourth microlens disposed on the seventh and eighth photoelectric conversion devices;
a first transfer gate disposed to correspond to the first photoelectric conversion device;
a second transfer gate disposed to correspond to the second photoelectric conversion device;
a reset gate;
a selection gate; and
a source follower gate,
wherein the first pixel group and the second pixel group are arranged in a first direction,
wherein the reset gate, the selection gate, and the source follower gate are connected to the first to eighth photoelectric conversion devices,
wherein the reset gate, the source follower gate, and the selection gate are aligned in the first direction,
wherein the first pixel group is disposed in a first pixel region and the second pixel group is disposed in a second pixel region, and
wherein the selection gate is not disposed on an axis extending in a second direction crossing the first direction and the axis is disposed between the first transfer gate and the second transfer gate.

2. The CMOS image sensor of claim 1, wherein the source follower gate is disposed between the reset gate and the selection gate.

3. The CMOS image sensor of claim 2, further comprising:
a first floating diffusion region disposed in the first pixel region;
a second floating diffusion region disposed in the second pixel region;
a first interlayer dielectric layer disposed on the substrate, and
wherein the first and second floating diffusion regions are connected to each other through a first line disposed on the first interlayer dielectric layer.

4. The CMOS image sensor of claim 3, further comprising:
a second interlayer dielectric layer on the first line and the first interlayer dielectric layer; and
a second line disposed on the second interlayer dielectric layer;
a first contact plug configured to penetrate the first interlayer dielectric layer and the second interlayer dielectric layer and to connect the source follower gate and the second line.

5. The COMS image sensor of claim 4, wherein at least one of the first to eighth photoelectric conversion devices has a first width that is substantially parallel to the first direction and a second width that is substantially parallel to the second direction, wherein the first width is less than the second width.

6. The COMS image sensor of claim 5, further comprising:
a second contact plug disposed to be directly adjacent to the reset gate, and
wherein the reset gate and the second contact plug are sequentially arranged in the first direction.

7. The COMS image sensor of claim 5, further comprising:
a single color filter disposed on the first and second photoelectric conversion devices.

8. The COMS image sensor of claim 5, wherein the selection gate, the source follower gate, and the reset gate are sequentially arranged in the first direction.

9. The CMOS image sensor of claim 7, further comprising
a first green filter disposed on the fifth and sixth photoelectric conversion devices;
a second green filter disposed on the third and fourth photoelectric conversion devices; and
a blue filter disposed on the seventh and eighth photoelectric conversion devices, and
wherein the single color filter is a red filter.

10. A complementary metal oxide semiconductor (CMOS) image sensor, comprising:
a first pixel region comprising first and second photoelectric conversion devices;
a second pixel region comprising third and fourth photoelectric conversion devices;
a third pixel region comprising fifth and sixth photoelectric conversion devices;
a fourth pixel region comprising seventh and eighth photoelectric conversion devices;
a first floating diffusion region disposed between the first pixel region and the second pixel region;
a second floating diffusion region disposed between the third pixel region and the fourth pixel region;
a plurality of first separation zones defining two photoelectric conversion devices in each of the first to fourth pixel regions and extending in a first direction;
a second separation zone between the first and second pixel regions and extending in a second direction perpendicular to the first direction;
a selection gate;
a source follower gate; and
a reset gate, wherein the reset gate, the selection gate, and the source follower gate are connected to the first to eighth photoelectric conversion devices, wherein the first to fourth pixel regions are arranged in a clockwise direction, wherein the first pixel region and the second pixel region are arranged in the first direction, and wherein the reset gate, the source follower gate, and the selection gate are aligned in the second direction.

11. The CMOS image sensor of claim 10, wherein the reset gate is disposed adjacent the third pixel region.

12. The CMOS image sensor of claim 11, wherein the reset gate is disposed next to the sixth photoelectric conversion device on the third pixel region.

13. The CMOS image sensor of claim 11, further comprising:
   a first interlayer dielectric layer disposed on a substrate, and
   wherein the first and second floating diffusion regions are connected to each other through a first line disposed on the first interlayer dielectric layer.

14. The COMS image sensor of claim 13, wherein the first line extends in the second direction.

15. The CMOS image sensor of claim 10, further comprising:
   a first contact plug disposed to be directly adjacent to the reset gate, and
   wherein the reset gate and the first contact plug are sequentially arranged in the second direction.

16. The CMOS image sensor of claim 13, further comprising:
   a second interlayer dielectric layer on the first line and the first interlayer dielectric layer; and
   a second line disposed on the second interlayer dielectric layer;
   a second contact plug configured to penetrate the first interlayer dielectric layer and the second interlayer dielectric layer and to connect the source follower gate and the second line.

17. The CMOS image sensor of claim 13, further comprising:
   a red filter disposed on the first and second photoelectric conversion devices.

18. The CMOS image sensor of claim 17, wherein the selection gate is disposed adjacent the second pixel region.

19. A complementary metal oxide semiconductor (CMOS) image sensor, comprising:
   a first pixel group comprising first to fourth photoelectric conversion devices, the first to fourth photoelectric conversion devices being arranged in a clockwise direction;
   a second pixel group comprising fifth to eighth photoelectric conversion devices, the fifth to eighth photoelectric conversion devices being arranged in the clockwise direction;
   a first separation zone in a substrate, the first separation zone being disposed between the first pixel group and the second pixel group;
   a second separation zone in the substrate, the second separation zone being disposed between the first photoelectric conversion device and the second photoelectric conversion devices;
   a third separation zone in the substrate, the third separation zone being disposed between the fifth photoelectric conversion device and the sixth photoelectric conversion device;
   a first microlens disposed on the first and second photoelectric conversion devices;
   a second microlens disposed on the third and fourth photoelectric conversion devices;
   a third microlens disposed on the fifth and sixth photoelectric conversion devices;
   a fourth microlens disposed on the seventh and eighth photoelectric conversion devices;
   a first transfer gate disposed to correspond to the first photoelectric conversion device;
   a second transfer gate disposed to correspond to the second photoelectric conversion device;
   a reset gate;
   a selection gate;
   a source follower gate;
   a first contact plug disposed to be directly adjacent to the reset gate;
   a first interlayer dielectric layer disposed on the substrate; and
   a first line disposed on the first interlayer dielectric layer,
   wherein the first pixel group and the second pixel group are arranged in a first direction,
   wherein the reset gate, the selection gate, and the source follower gate are connected to the first to eighth photoelectric conversion devices,
   wherein the selection gate, reset gate, and first contact plug are sequentially aligned in the first direction,
   wherein the first pixel group is disposed in a first pixel region and the second pixel group is disposed in a second pixel region, and
   wherein the selection gate is not disposed on an axis extending in a second direction crossing the first direction and the axis is disposed between the first transfer gate and the second transfer gate.

20. The CMOS image sensor of claim 19, further comprising:
   a first floating diffusion region disposed in the first pixel region; and
   a second floating diffusion region disposed in the second pixel region,
   wherein the first and second floating diffusion regions are connected to each other through the first line, and
   wherein the first line extends in the first direction.

21. The CMOS image sensor of claim 20, further comprising:
   a single microlens is disposed on the first and second photoelectric conversion devices.

* * * * *